(12) United States Patent
Nagatani et al.

(10) Patent No.: US 8,792,546 B2
(45) Date of Patent: Jul. 29, 2014

(54) TRANSMISSION CIRCUIT

(75) Inventors: Kazuo Nagatani, Kawasaki (JP); Eisuke Fukuda, Kawasaki (JP); Yasushi Yamao, Tokyo (JP)

(73) Assignees: Fujitsu Limited, Kawasaki (JP); The University of Elecro-Communications, Tokyo (JP)

( * ) Notice: Subject to any disclaimer, the term of this patent is extended or adjusted under 35 U.S.C. 154(b) by 173 days.

(21) Appl. No.: 13/529,178

(22) Filed: Jun. 21, 2012

(65) Prior Publication Data

US 2012/0257670 A1 Oct. 11, 2012

Related U.S. Application Data

(63) Continuation of application No. PCT/JP2010/072817, filed on Dec. 17, 2010.

(30) Foreign Application Priority Data

Dec. 22, 2009 (JP) ................................. 2009-291060

(51) Int. Cl.
H04L 27/36 (2006.01)
(52) U.S. Cl.
USPC ........... 375/238; 375/295; 375/296; 375/297; 375/300; 375/302; 375/271
(58) Field of Classification Search
CPC ..... H03F 2000/331; H03F 3/24; H03F 3/217; H03F 2200/324; H03F 1/0272; H03F 2200/393; H03F 1/0211; H03F 1/0227; H03F 1/26; H03F 1/3282; H03F 1/0233; H03C 5/00; H04B 1/0475

USPC .......... 375/295, 296, 297, 300, 302, 238, 271
See application file for complete search history.

(56) References Cited

U.S. PATENT DOCUMENTS

| | | | |
|---|---|---|---|
| 7,496,334 B2 | 2/2009 | Saito | |
| 7,742,543 B2 | 6/2010 | Maeda | |

(Continued)

FOREIGN PATENT DOCUMENTS

| | | |
|---|---|---|
| JP | 2002-325109 | 11/2002 |
| JP | 2005-286995 | 10/2005 |

(Continued)

OTHER PUBLICATIONS

International Preliminary Report on Patentability and Written Opinion of the International Searching Authority dated Jul. 4, 2012, from corresponding International Application No. PCT/JP2010/072817.

(Continued)

*Primary Examiner* — Siu Lee
(74) *Attorney, Agent, or Firm* — Katten Muchin Rosenman LLP

(57) ABSTRACT

A transmission circuit comprises a $\Sigma{-}\Delta$ modulator to perform $\Sigma{-}\Delta$ modulation of an amplitude modulation component of a modulation signal and to output a pulse width modulation signal, an angle modulator to generate an angle modulation component signal of a signal obtained by multiplying the modulation signal by a transmission output control coefficient corresponding to a transmission output in a power amplifier, and a multiplier to multiply the pulse width modulation signal by the angle modulation component signal and to output a result of the multiplication as an output signal to the power amplifier.

8 Claims, 12 Drawing Sheets

(56) References Cited

U.S. PATENT DOCUMENTS

| | | |
|---|---|---|
| 7,826,554 B2 | 11/2010 | Haque et al. |
| 2002/0186440 A1 | 12/2002 | Adachi et al. |
| 2007/0013567 A1 | 1/2007 | Matsuura et al. |
| 2007/0147541 A1 | 6/2007 | Saito |
| 2007/0165746 A1 | 7/2007 | Maeda |
| 2007/0211821 A1 | 9/2007 | Haque et al. |
| 2008/0068240 A1 | 3/2008 | Matsuura |
| 2009/0285329 A1* | 11/2009 | Matsuoka et al. ............ 375/297 |
| 2011/0007794 A1* | 1/2011 | Vromans ...................... 375/238 |

FOREIGN PATENT DOCUMENTS

| | | |
|---|---|---|
| JP | 2008-104160 | 5/2008 |
| JP | 2009-523327 | 6/2009 |
| JP | 2009-530914 | 8/2009 |
| WO | 2007/004518 | 1/2007 |

OTHER PUBLICATIONS

International Search Report dated Mar. 22, 2011, from corresponding International Application No. PCT/JP2010/072817.

* cited by examiner

TRANSMISSION CIRCUIT

CROSS-REFERENCE TO RELATED APPLICATION

This application is a continuation of International Application PCT/JP2010/072817 which was filed on Dec. 17, 2010, and claims priority from Japanese Patent Application 2009-291060 which was filed on Dec. 22, 2009, the contents of which are herein wholly incorporated by reference.

FIELD

The present invention relates to a transmission circuit.

BACKGROUND

In a line type modulation system as a mainstream of the third generation mobile telecommunications (3G) and the prospective wireless communications, it is desired to realize a transmission apparatus capable of amplifying with no distortion at high power efficiency. The line type modulation involves fluctuations in envelope, and therefore an amplifier is designed and operated by taking a ratio (Peak to Average Ratio) between a signal peak and average power into consideration. Hence, such a problem exists that the transmission apparatus decreases in power efficiency.

A transmission circuit apparatus as depicted in FIG. 1 is exemplified as one of the prior arts (refer to, e.g., Patent document 1). According to a technology of this transmission circuit apparatus, as illustrated in FIG. 1, a data generator 5 outputs angle modulation data defined as angle component of a modulated wave and amplitude modulation data defined as an amplitude component of the modulated wave, respectively. Herein, a carrier wave c(t) having a frequency $f_c$ may be expressed in the following formula 1.

$$c(t)=\cos(2\pi f_c t)=Re[e^{j2\pi f_c t}] \quad \text{(Formula 1)}$$

A modulated wave e(t) with respect to the carrier wave c(t) may be expressed in the following formulae 2 and 3 by using a complex envelop E(t).

$$e(t)=A(t)\{\cos(\phi(t))\cdot\cos(2\pi f_c t)-\sin(\phi(t))\cdot\sin(2\pi f_c t)\}$$
$$=Re[E(t)e^{j2\pi f_c t}] \quad \text{(Formula 2)}$$

$$E(t)=A(t)\cdot e^{j\phi(t)} \quad \text{(Formula 3)}$$

Wherein A(t) represents amplitude (amplitude component) of the modulated wave. The symbol $\phi(t)$ denotes a phase (angle component), the frequency is defined as a differential of the phase, and hence both of the phase and the frequency may be generally treated as the angle components.

A frequency modulator 1 depicted in FIG. 1 generates a signal that is modulated with an angle component $\phi(t)$. On the other hand, the amplitude component A(t) is converted by a $\Sigma$-$\Delta$ modulator (or $\Delta$-$\Sigma$ modulator) 3 into a pulse width modulation (PWM) signal. The amplitude component converted into the PWM format, i.e., a PWM signal A'(t) and the signal undergoing the angle modulation are modulated by the amplitude modulator 2. An output of the amplitude modulator 2 becomes a signal into which the angle modulated wave having fixed amplitude is set ON or OFF depending on "1" or "0" of the PWM signal.

The amplitude of the amplitude modulator 2 such as this takes a value "0" or a fixed value. Accordingly, even when the output signal is amplified by an unillustrated class B or C power amplifier disposed at a rear stage of the amplitude modulator 2, no distortion occurs, and besides the signal may be transmitted at high power efficiency inherent to the class B or C power amplifier.

If kept as it is, however, a quantization noise pertaining to the PWM signal might be output as a noise out of a transmission band. To be specific, the PWM signal A' (t) is what an error $Q_A(t)$ corresponding to the quantization noise is added to the amplitude component A(t), and may be expressed in the formula 4 given below.

$$A'(t)=A(t)+Q_A(t) \quad \text{(Formula 4)}$$

When the amplitude modulator 2 modulates the amplitude of the angle modulated wave having the fixed amplitude by use of the PWM signal A'(t) such as this, the quantization noise undergoing the amplitude modulation with a quantization noise Q(t) occurs also in the output of the amplitude modulator 2. A large proportion of the quantization noise becomes a component out of the transmission band and is therefore attenuated by a band pass filter (BPF) 4, thereby enabling a residual component $Q_A'(t)$ of the quantization noise to be reduced.

Thus, in the transmission circuit apparatus (prior art) depicted in FIG. 1, the transmission signal with large fluctuations in envelope may be transmitted at the high efficiency with no distortion.

[Patent document 1] Japanese Patent Application Laid-Open Publication No. 2002-325109

The quantization noise occurs in the process of the modulation made by the $\Sigma$-$\Delta$ modulator described above. Therefore, in the case of desiring to vary average power of the transmission signal (such as decreasing the output power), if trying to realize power control by controlling an amplitude of the signal, it is hard to satisfy standards for the noise power out of the transmission band.

SUMMARY

One aspect of the present invention is a transmission circuit. This transmission circuit includes: a $\Sigma$-$\Delta$ modulator to perform $\Sigma$-$\Delta$ modulation of an amplitude modulation component of a modulation signal and to output a pulse width modulation signal; an angle modulator to generate an angle modulation component signal of a signal obtained by multiplying the modulation signal by a transmission output control coefficient corresponding to a transmission output in a power amplifier; and a multiplier to multiply the pulse width modulation signal by the angle modulation component signal and to output a result of the multiplication as an output signal to the power amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will hereinafter be described with reference to the drawings. Configurations in the embodiments are exemplifications.

Circumstances of Embodiment

Figure 1:
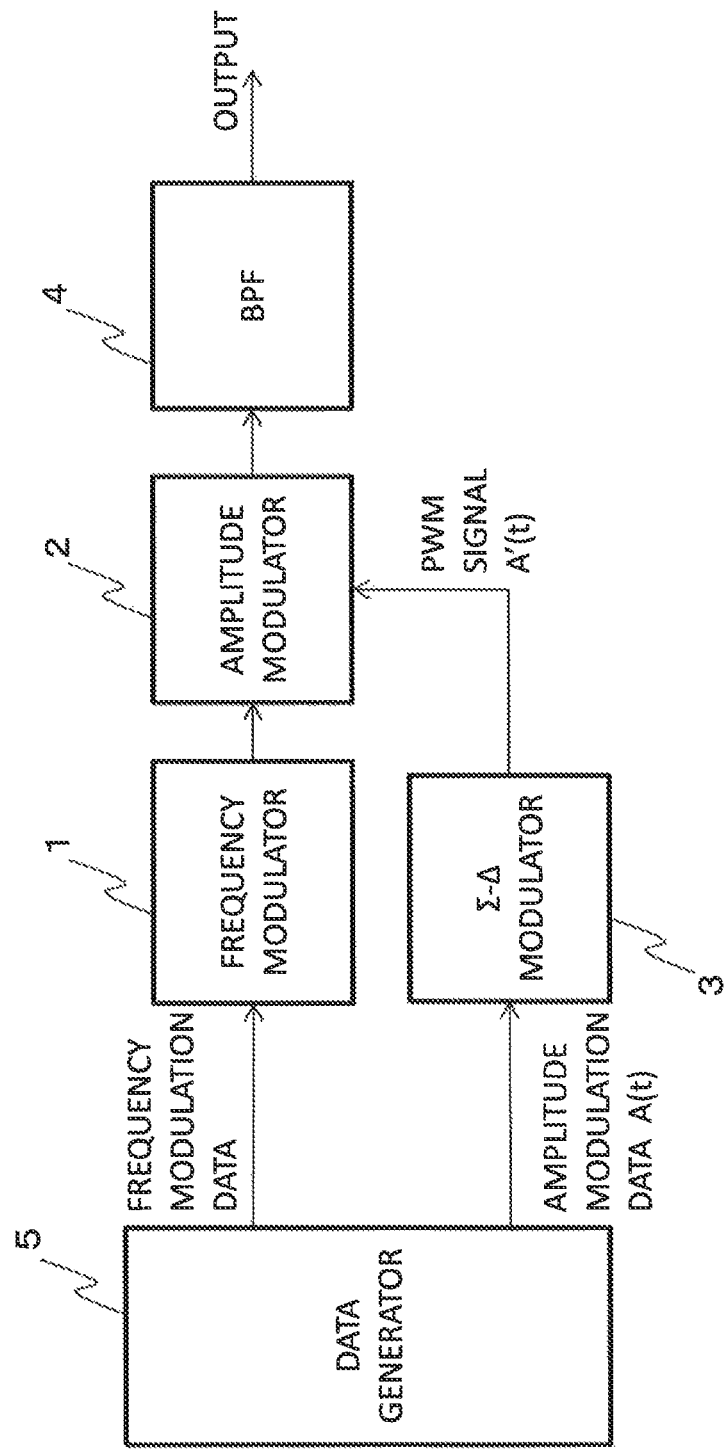
FIG. 1 is a diagram of a configuration of a conventional transmission apparatus.

A mobile phone system involves performing transmission output control (Transmission Power Control: TPC) for controlling a transmission output to a proper level of electric power in a manner that corresponds to a distance between a base station and a terminal and an ambient radio environment. In the case of changing the transmission output with a configuration of the prior art illustrated in FIG. 1, it is considered that a PWM signal $A''(t)$ is generated by use of data obtained by multiplying an amplitude component $A(t)$ by a TPC control coefficient KA (where KA≤1, and 1 is a rated output). The PWM signal $A''(t)$ may be expressed by the following formula 5.

$$A''(t)=K_A A(t)+Q_A(t) \quad \text{(Formula 5)}$$

Further, when expressing a complex envelop $E''(t)$ of a modulated wave (which is an output to the BPF 4) by using the PWM signal $A''(t)$ expressed in the formula 5, $E''(t)$ is given in the following formula 6.

$$E''(t)=A''(t)\cdot e^{j\phi(t)}=(K_A A(t)+Q_A(t))e^{j\phi(t)}=K_A A(t)e^{j\phi(t)}+Q_A(t)e^{j\phi(t)} \quad \text{(Formula 6)}$$

It is understood from the formula (6) that the electric power having an error $Q_A(t)$ corresponding to a quantization noise gets substantially fixed without depending on the TPC control coefficient $K_A$. On the other hand, the transmission signal power decreases depending on the TPC control coefficient $K_A$, and hence a signal-to-noise ratio (SN ratio) deteriorates in proportion to $K_A$, with the result that the SN ratio of the output of the BPF 4 similarly deteriorates.

It is compulsory for a noise level out of a transmission band to decrease corresponding to the transmission output, and a transmission circuit apparatus of the prior art is hard to sufficiently satisfy a requirement for the noise level. Further, there is another problem that a noise (Error Vector Magnitude: EVM) contained in the transmission signal increases, resulting in a decline of the signal quality.

The embodiment will discuss, in view of the problems described above, a transmission circuit capable of restraining the noises out of the transmission band within a proper range even in the case of making the transmission output variable.

First Embodiment

Figure 2:
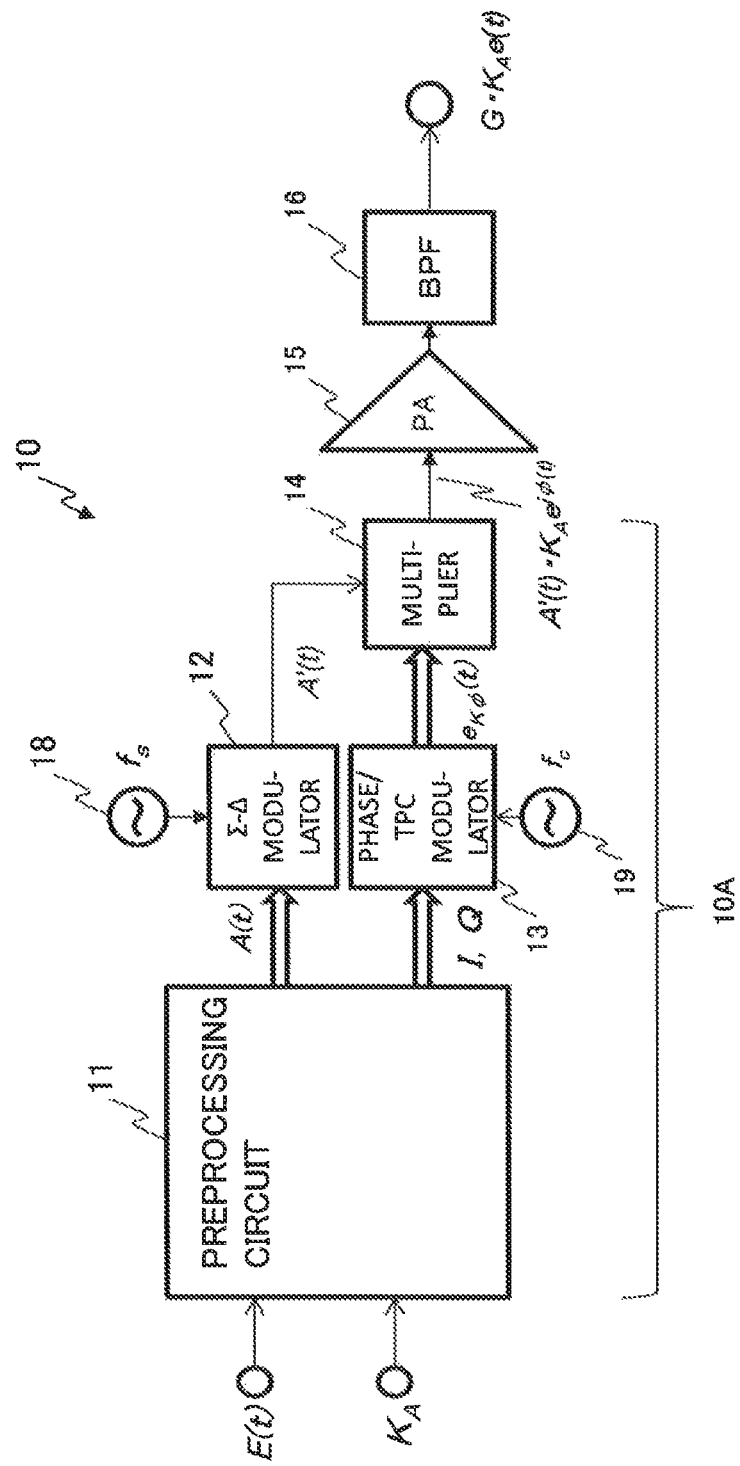
FIG. 2 is a diagram illustrating an example of a configuration of the transmission apparatus including a transmission circuit in a first embodiment.

FIG. 2 is a diagram illustrating an example of a configuration of a transmission apparatus including a transmission circuit in a first embodiment. In FIG. 2, a transmission apparatus 10 includes a transmission circuit 10A, a power amplifier (which is abbreviated to PA and also referred to as a saturation amplifier) 15 connected to the transmission circuit, and a band-pass filter (BPF) 16 connected to the power amplifier 15, in which an unillustrated transmission antenna is connected to an output terminal of the BPF 16.

The transmission circuit 10A includes a preprocessing circuit 11 to which modulation inputs (the complex envelop $E(t)$ and the TPC control coefficient $K_A$) are inputted from an input terminal, a Σ-Δ modulator (Δ-Σ modulator) 12 connected to the preprocessing circuit 11, a phase/TPC modulator 13 connected to the preprocessing circuit 11, and a multiplier 14 to which an output signal of the Σ-Δ modulator 12 and an output signal of the phase/TPC modulator 13 are inputted, in which an output of the multiplier 14 is inputted to the PA 15.

The preprocessing circuit 11 inputs a signal representing an amplitude component $A(t)$ of the modulated wave $e(t)$ to the Σ-Δ modulator 12. The Σ-Δ modulator 12 modulates the amplitude component $A(t)$ into a PWM-formatted amplitude component $A'(t)$ by use of a sampling clock $f_s$ given from an oscillator 18. The amplitude component $A'(t)$ is inputted as a PWM signal to the multiplier 14.

Further, the preprocessing circuit 11 conducts a polar coordinate transformation of the complex envelop $E(t)$ of the modulated wave $e(t)$. The preprocessing circuit 11 generates baseband signals of an in-phase component I and a quadrature component Q of the modulated wave $e(t)$, which are multiplied by an instantaneous phase $\phi(t)$ of the modulated wave $e(t)$ and the TPC control coefficient $K_A$, and then inputs the baseband signals to the phase/TPC modulator 13.

The phase/TPC modulator 13, which is a quadrature modulator, outputs an angle modulated wave $e_{K\phi}(t)$ obtained by quadrature-modulating a carrier wave fc coming from an oscillator 19 by the baseband signals I, Q. The multiplier 14 outputs, to the power amplifier 15, a modulation signal obtained by multiplying the angle modulated wave coming from the phase/TPC modulator 13 by the PWM signal coming from the Σ-Δ modulator 12. The power amplifier 15 amplifies the signal with a predetermined level of transmission power and connects the output to the BPF 16. The BPF 16 removes the signals out of the transmission band. Output signals of the BPF 16 are connected to an unillustrated transmission antenna and are electromagnetically radiated therefrom.

A scheme in the first embodiment is not that the TPC control is performed by using the amplitude modulation component but that the transmission output control is implemented by multiplying the angle modulation component by the TPC control coefficient $K_A$. A complex envelop $E_{K\phi}(t)$ of the angle modulated wave undergoing the transmission output control may be expressed in the following formula (7).

$$E_{K\phi}(t)=K_A e^{j\phi(t)} \quad \text{(Formula 7)}$$

The carrier wave is modulated by inputting the complex envelop $E_{K\phi}(t)$ to the phase/TPC modulator 13, whereby the angle modulated wave undergoing the transmission output control may be generated. The output signal from the phase/TPC modulator 13 is amplitude-modulated by the PWM signal $A'(t)$ from the Σ-Δ modulator 12 in the multiplier 14. The modulation signal undergoing the transmission output control may be thereby obtained as the output of the multiplier 14. In this case, it is understood that the PWM signal $A'(t)$ is independent of the transmission output control but is not, when depicting a ratio of the quantization noise to the signal power by using the complex envelop, affected by the transmission output control as expressed in the following formula (8).

$$E'(t)=A'(t)\cdot K_A e^{j\phi(t)}=K_A(A(t)+Q_A(t)e^{j\phi(t)}=K_A A(t)e^{j\phi(t)}+K_A Q_A(t)e^{j\phi(t)}$$ (Formula 8)

Figure 3:
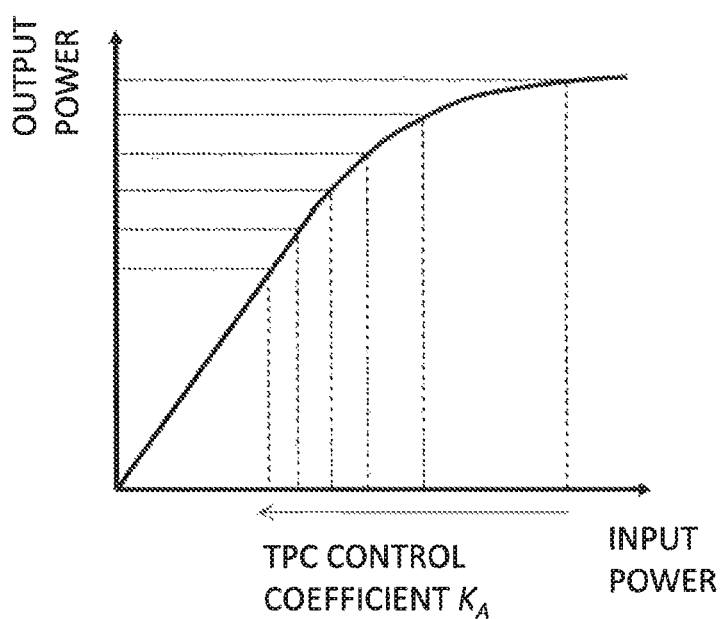
FIG. 3 is a graph illustrating I/O characteristics of a power amplifier.

In the example of the configuration in FIG. 2, the whole input signals to the power amplifier 15 are multiplied by the amplitude coefficient such as the TPC control coefficient $K_A$. The output of the power amplifier 15 is thereby varied. FIG. 3 is a graph representing an input/output characteristic of the power amplifier 15. In general, the I/O characteristic of the power amplifier 15 is not linear. Accordingly, the amplitude control coefficient, i.e., the TPC control coefficient $K_A$ may be determined to obtain a desired output in a way that takes the I/O characteristic of the power amplifier 15 into consideration. For example, a value of the input power is determined so that the output power rises at a fixed interval (refer to FIG. 3), and the TPC control coefficient $K_A$ corresponding to the input power may be determined.

Figure 4:
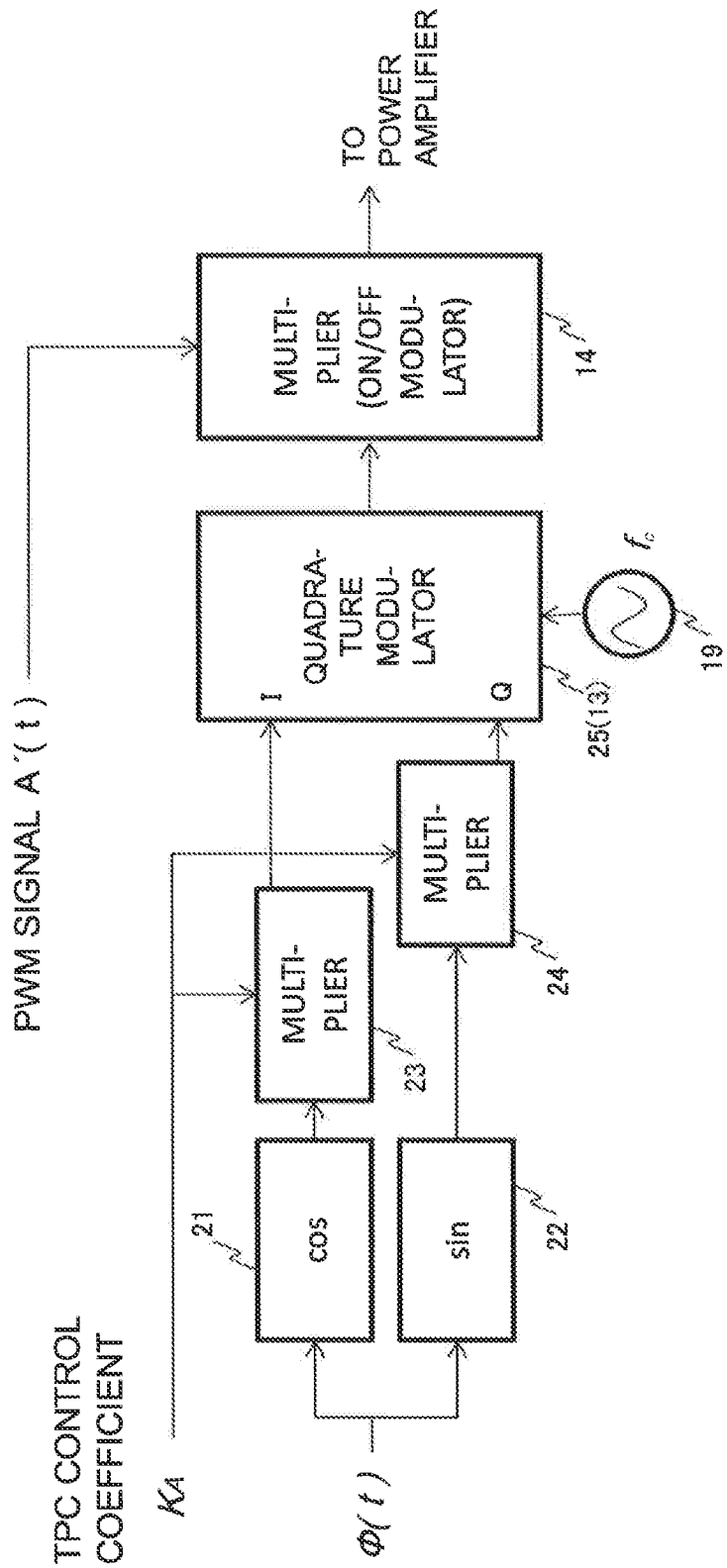
FIG. 4 is an explanatory diagram illustrating details of a part of a preprocessing circuit and a phase/TPC modulator.

As described above, the quadrature modulator may be employed as the phase/TPC modulator 13. FIG. 4 is an explanatory diagram illustrating details of a part of the preprocessing circuit 11 and the phase/TPC modulator 13. As depicted in FIG. 4, the preprocessing circuit 11 includes a cosine transformer 21 which obtains a cosine $\phi(t)$ with respect to the instantaneous phase $\phi(t)$ of the modulated wave e(t), a sine transformer 22 which obtains a sine sin $\phi(t)$ with respect to the instantaneous phase $\phi(t)$, and multipliers 23, 24 which multiply cosine $\phi(t)$ and sin $\phi(t)$ by the TPC control coefficient $K_A$.

With the configuration such as this, the baseband signal (the in-phase component I=$K_A$ cos $\phi(t)$) of the in-phase component I is output from the multiplier 23, while the baseband signal (the quadrature component Q=$K_A$ sin $\phi(t)$) of the quadrature component Q is output from the multiplier 24. The quadrature modulator 25, i.e., the phase/TPC modulator 13 quadrature-modulates the carrier waves $f_c$ with the baseband signals I, Q. As a result, the angle modulated wave, undergoing the transmission output control, which exhibits the complex envelop $E_K\phi(t)$ given such as $E_K\phi(t)=K_A e^{j\phi(t)}$, can be generated as the output signal of the quadrature modulator 25. The transmission output expressed in the formula (8) is acquired in such a way that the multiplier 14 multiplies this angle modulated wave by the PWM signal A' (t).

Figure 5:
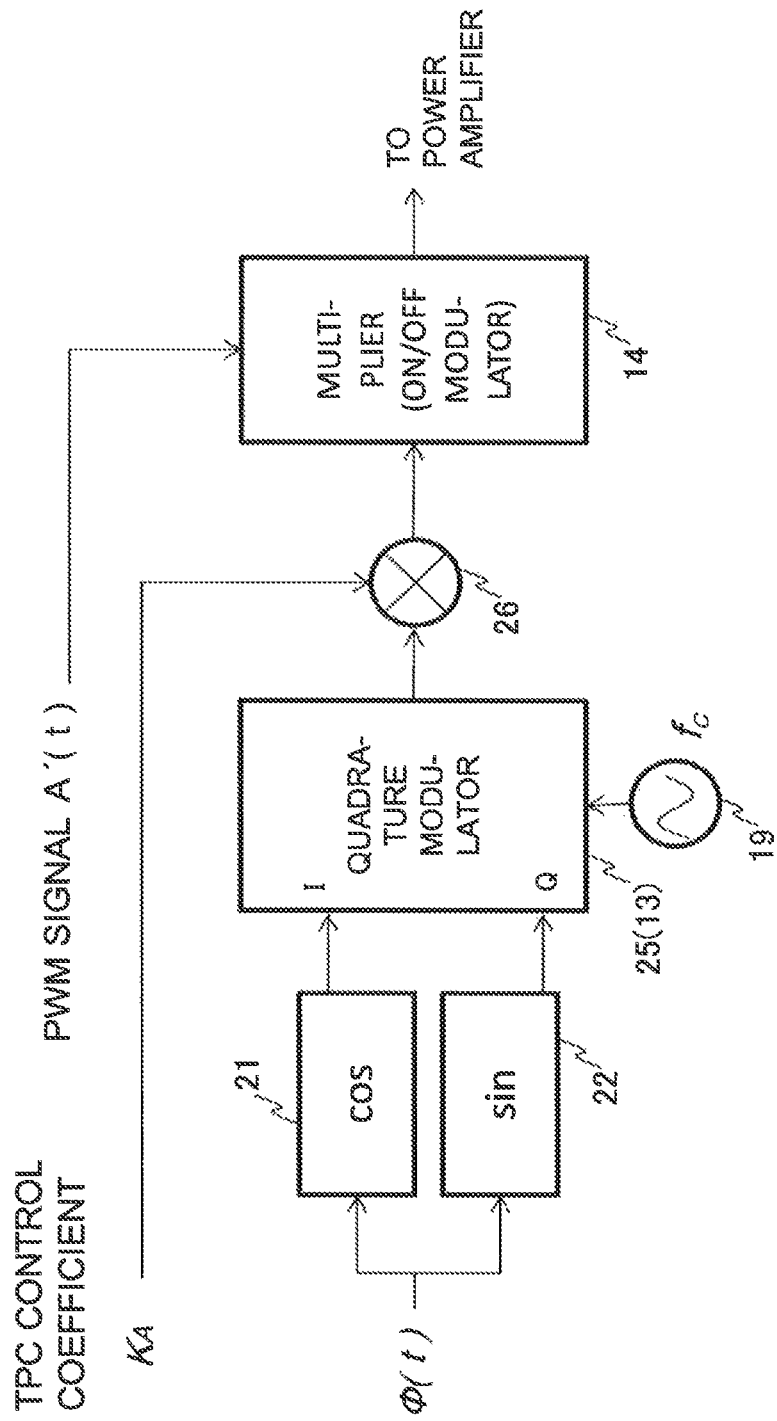
FIG. 5 is a diagram illustrating a modified example of the transmission circuit in the first embodiment.

The configurations illustrated in FIGS. 2 and 4 can be modified as depicted in FIG. 5. FIG. 5 illustrates a modified example of the transmission circuit. In the example depicted in FIG. 5, a gain adjuster 26 is inserted in between the (the phase/TPC modulator 13) and the multiplier 14 in place of omitting the multipliers 23, 24. This gain adjuster 26 receives an input of the TPC control coefficient $K_A$.

The example illustrated in FIG. 5 is that the gain adjuster 26 not on the input side but on the output side of the quadrature modulator 25 (the phase/TPC modulator 13) multiplies the angle modulated wave coming from the quadrature modulator 25 by the TPC control coefficient $K_A$.

According to the first embodiment, the multiplier 14 multiplies the quantization noise contained in the PWM signal output from the Σ-Δ modulator 12 by the angle modulation signal obtained from the multiplication of the TPC control coefficient $K_A$ ($K_A \le 1$(rate value)). Along with this multiplication, the quantization noise is multiplied by not only the signal component but also the TPC control coefficient $K_A$ (Formula 8), thereby enabling the SN ratio to be kept prefer-ably while restraining the transmission output from being affected by the quantization noise. As a result, the high-quality signal can be transmitted. According to the embodiment, it is feasible to realize the transmission circuit which restrains the ratio of the power of the transmission signal to the power out of the transmission band within the proper range.

Further, according to the first embodiment, the quantization noise is not affected by the transmission output control, and hence there is no necessity for previously using an extremely high oversampling frequency in order to reduce the affection of the quantization noise, whereby the transmission output control over a wide range can be attained. Accordingly, realization of the circuit is facilitated, and it is feasible to realize the linear transmission apparatus that restrains power consumption but exhibits high efficiency.

Second Embodiment

Next, a second embodiment will be described. The same components as those in the first embodiment are marked with the same symbols and numerals, while the descriptions thereof are omitted. Generally, the power efficiency of the power amplifier reaches the highest level in the vicinity of the maximum output but decreases in a low status of the transmission output. Therefore, when a level of the input signal to the power amplifier is reduced based on the TPC control coefficient, the power amplification efficiency decreases. The second embodiment will discuss the transmission apparatus configured to improve the decrease in power amplification efficiency.

Figure 6:
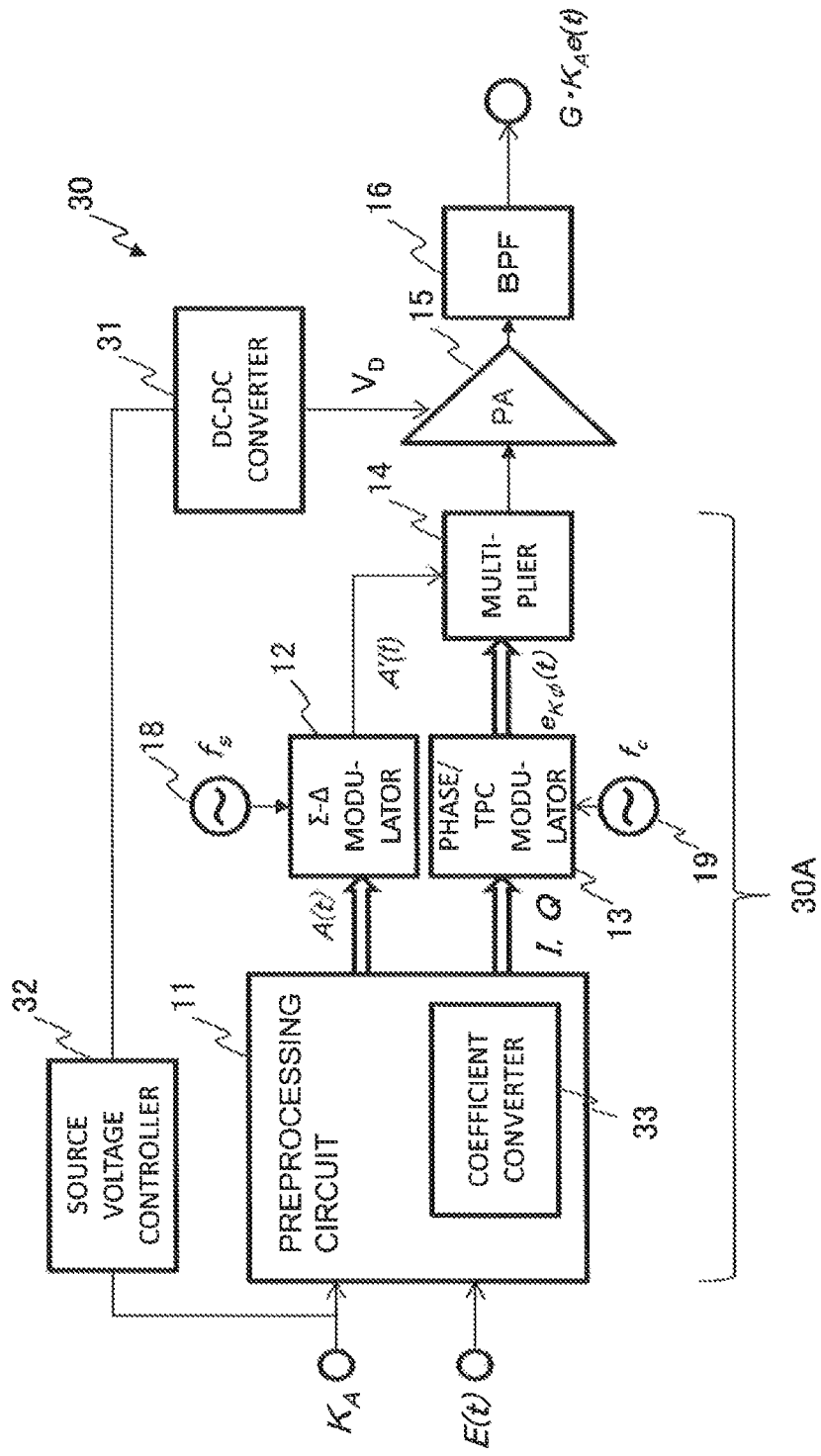
FIG. 6 is a diagram illustrating an example of a configuration of the transmission apparatus in a second embodiment.

FIG. 6 is a diagram illustrating an example of a configuration of a transmission apparatus 30 in a second embodiment. The transmission apparatus 30 is different from the first embodiment in terms of such a point that a transmission circuit 30A includes a DC-DC converter 31 and a source voltage controller 32 in addition to the components explained in the first embodiment. Another difference is such a point that the preprocessing circuit 11 includes a coefficient transformer 33 which transforms the TPC control coefficient $K_A$ into a correction coefficient $K_A'$ defined as a correction value of the TPC control coefficient.

The preprocessing circuit 11 receives an input of the TPC control coefficient $K_A$ that takes the transmission output control into consideration. Namely, the TPC control coefficient $K_A$, of which a value corresponds to the transmission output, is inputted thereto. The source voltage controller 32 includes a recording medium (e.g., a memory: not illustrated) to store a source voltage $V_D$ corresponding to the TPC control coefficient $K_A$. A proper value corresponding to the value of the TPC control coefficient $K_A$ is predetermined as the source voltage $V_D$ and stored in the memory. As an example, the values $K_A$ and $V_D$ may be stored in a source voltage table in the memory. The source voltage controller 32 receives the TPC control coefficient $K_A$ inputted to the preprocessing circuit 11, then reads the source voltage value $V_D$ corresponding to the TPC control coefficient $K_A$, and gives this source voltage value $V_D$ to the DC-DC converter 31.

The DC-DC converter 31 is controlled so that the source voltage of the power amplifier 15 becomes the source voltage value $V_D$ obtained from the power source voltage controller. With this contrivance, the power amplifier 15 is supplied with the source voltage value $V_D$ which makes preferable the power amplification efficiency of the power amplifier 15.

On the other hand, the coefficient transformer 33 includes the recording medium (memory) which previously gets stored with a value representing a relation between the TPC control coefficient $K_A$ and the correction coefficient. The preprocessing circuit 11, upon receiving the input of the TPC control coefficient $K_A$, reads the correction coefficient $K_A'$ corresponding thereto. The angle modulated wave is multiplied by the readout correction coefficient $K_A'$.

According to the second embodiment, it is possible to acquire the same operational effects as those in the first embodiment. According to the second embodiment, further, the source voltage value $V_D$ corresponding to the TPC control coefficient $K_A$ is supplied to the power amplifier 15, whereby the power amplification efficiency of the power amplifier 15 may be made proper. Moreover, the TPC control coefficient $K_A$, by which the angle modulation component is multiplied, may be corrected.

Note that one of the power source voltage controller 32 and the coefficient transformer 33 may be omitted in the second embodiment. Namely, one of the source voltage (applied voltage) control and the coefficient control may be conducted.

First Specific Example

A specific method of how the correction coefficient $K_A'$ is determined from the TPC control coefficient $K_A$ in the second embodiment will be described. The TPC (Transmission Power Control) is control of a transmission output voltage value, in which the TPC control coefficient $K_A$ represents the transmission output that is output as a transmitter. The transmission circuit 30A in the second embodiment multiplies the angle modulation component by the TPC control coefficient. It is therefore taken into consideration that the power amplifier 15 operates from a low power area to a high power area. Especially, an operation point is located in a saturation area of the power amplifier 15, in which case the TPC control coefficient taking account of affection of a nonlinear characteristic of the power amplifier 15 is transformed.

Figure 7:
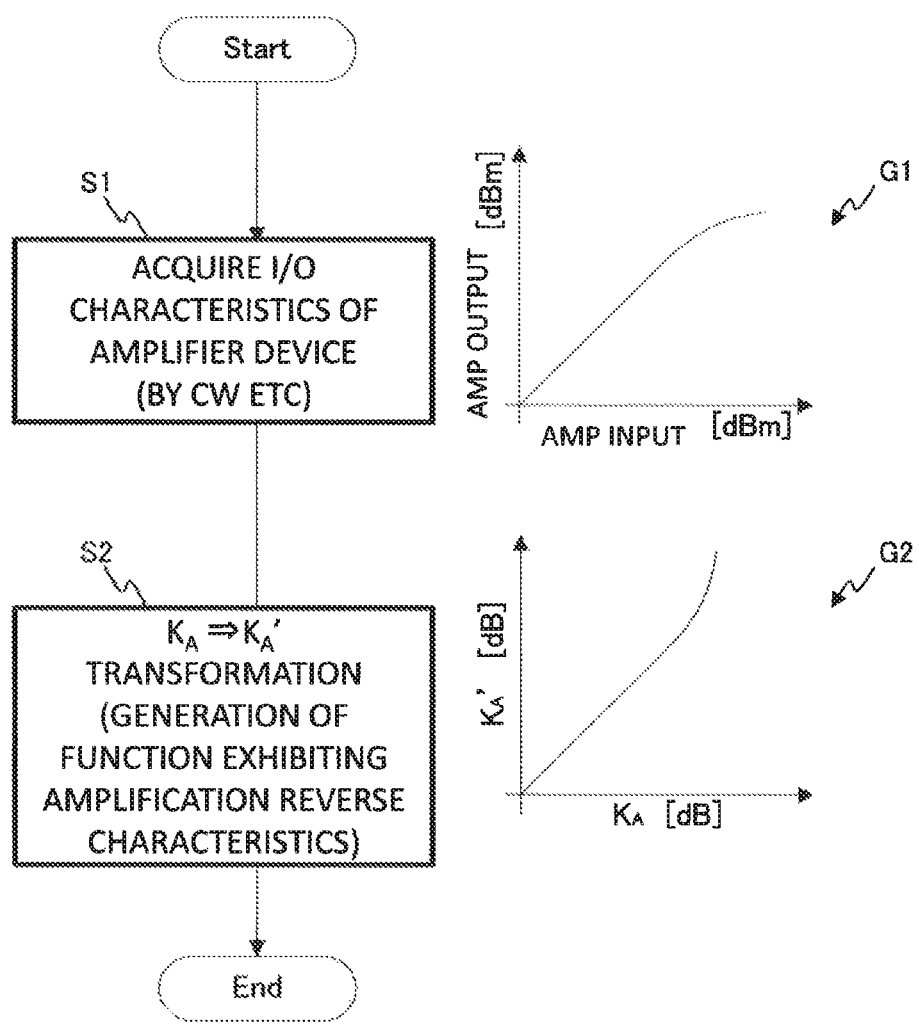
FIG. 7 is an explanatory diagram of how a correction coefficient of a TPC control coefficient is determined.

FIG. 7 is an explanatory diagram for determining the correction coefficient. The transformation of the TPC control coefficient $K_A$ into the correction coefficient $K_A'$ requires I/O characteristics of the power amplifier 15. Hence, the I/O characteristics of the amplifier device, i.e., the power amplifier 15 are obtained by use of CW (Continuous Wave) or pulse signals (S1 in FIG. 7). The I/O characteristics of the power amplifier 15 may be thereby obtained as indicated by a graph G1 in FIG. 7.

Next, a coefficient transformation map is generated. To be specific, this involves generating a function f(x) representing a relation between the TPC control coefficient $K_A$ and the correction coefficient $K_A'$, the function having characteristics opposite to the I/O characteristics of the power amplifier 15 that are acquired in S1 (S2 in FIG. 7). The $K_A$-to-$K_A'$ coefficient transformation map as depicted by a graph G2 in FIG. 7 is thereby generated. The coefficient transformation map is stored beforehand in the memory held by the coefficient transformer 33. Alternatively, the function f(x) may also be stored in the memory.

Furthermore, the control such as the following may be done. For example, $K_A$ exhibiting the maximum transmission output is defined as $K_{A\_MAX}$, and it is assumed that $K_{A\_MAX}$ is inputted to the preprocessing circuit 11. Any control is not performed by the power source voltage controller 32. Herein, in the case of performing the transmission with the power that is lower by −3 dB than $K_{A\_MAX}$, the coefficient transformer 33 makes the following calculation by using the function f(x).

$$K_A' = f(K_{A\_MAX} + (-3))[dB] \quad \text{(Formula A)}$$

The following calculation is carried out for transforming this formula A into a true value of $K_A'$.

$$K_A' = 10^{f(K_{A\_MAX} + (-3))/20}[\text{True value}] \quad \text{(Formula B)}$$

Then, the angle modulation component is multiplied by the correction coefficient $K_A'$ obtained from the formula B. The transmission may be thereby done with the power that is lower by −3 dB than $K_{A\_MAX}$.

Second Specific Example

Described next is a specific method of how a value of the electric power applied to the power amplifier 15 (Amp) is determined from the TPC control coefficient $K_A$. The amplifier device, i.e., the power amplifier operates at the high amplification efficiency in the saturation area. In the case of outputting the low electric power, however, the efficiency of the amplifier decreases. The input signal to the power amplifier based on the Σ–Δ modulation method is a binary signal, in which the power amplifier becomes an ON-state when the PWM signal is ON, i.e., "1" and operates in the saturation area with the high efficiency. By contrast with this, the power amplifier becomes an OFF-state when the PWM signal is OFF, i.e., "0". The power consumption in the OFF-state is "0".

In the transmission apparatuses in the first and second embodiments, the angle modulation component is multiplied by the TPC control coefficient, and the multiplier 14 multiplies the PWM signal by this angle modulation component. This indicates that the power amplifier is used in a manner that shifts the ON-state of this power amplifier to the low efficiency area from the high efficiency area. Then, it is feasible to adopt a configuration for changing, corresponding to the output voltage, a voltage $V_{Amp}$ applied to the power amplifier so as to perform the operation with the high efficiency also when in the low output power.

Figure 8:
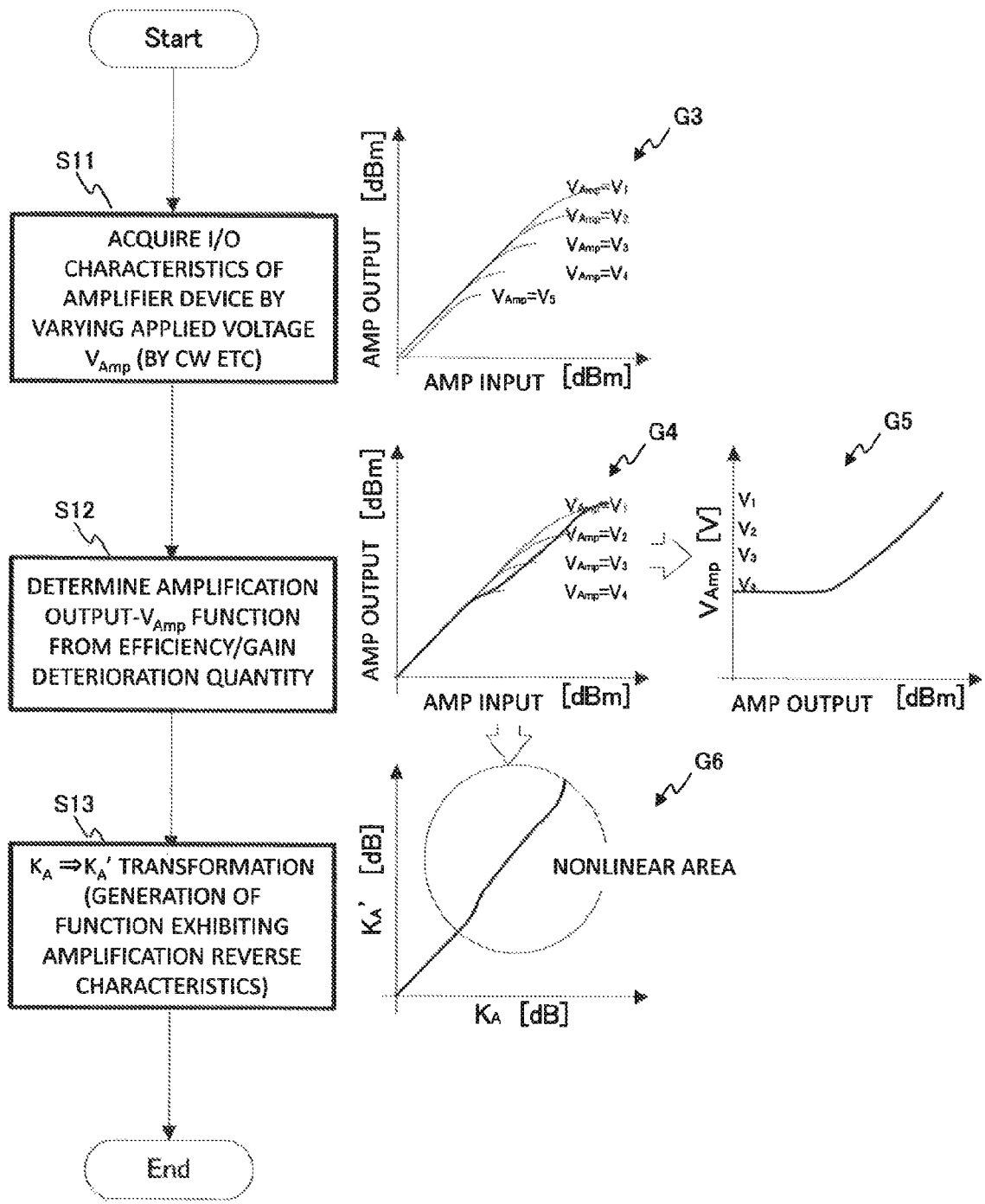
FIG. 8 is an explanatory diagram of how a source voltage value is determined.

FIG. 8 is an explanatory diagram for determining the voltage value. At first, in several applied voltages $V_{Amp}$, the I/O characteristics of the power amplifier are previously obtained by employing the CW (Continuous Wave) or the pulse signals (S11 in FIG. 8). Through this process, a graph G3 depicted in FIG. 8 is obtained.

Next, a function representing the I/O characteristics of the power amplifier is acquired based on the amplification efficiency and a gain deterioration quantity (a graph G4 in FIG. 8), and a function representing a relation between the output voltage of the power amplifier and the applied voltage $V_{Amp}$ thereto is determined by use of the function acquired above (S12 in FIG. 8). A graph G5 in FIG. 8 is thereby acquired. On the other hand, there is obtained a function having characteristics opposite to those of the graph G4 with respect to the correction coefficient $K_A'$ (S13 in FIG. 8). A graph G6 in FIG. 8 is thereby obtained.

The TPC control coefficient $K_A$ inputted to the preprocessing circuit 11 is determined based on the output voltage (Amp output) of the power amplifier. The memory of the source voltage controller 32 is stored with a table of the transformation from the TPC control coefficient into the applied voltage $V_{Amp}$, i.e., the source voltage $V_D$, the transformation table being created based on the graph G5. Owing to this table, the source voltage controller 32 may apply the applied voltage $V_{Amp}$ ($V_D$) corresponding to the TPC control coefficient $K_A$ to the power amplifier 15 via the DC-DC converter 31.

Further, the memory of the coefficient transformer 33 gets stored with the function, the map or the table on the basis of the graph G6, thereby enabling the TPC control coefficient to be transformed into the correction coefficient. With this transformation, the angle modulation component may be multiplied by the correction coefficient corresponding to the nonlinear area in the I/O characteristics of the power amplifier, and an operation of the highly efficient amplification may be conducted.

Third Embodiment

Figure 9:
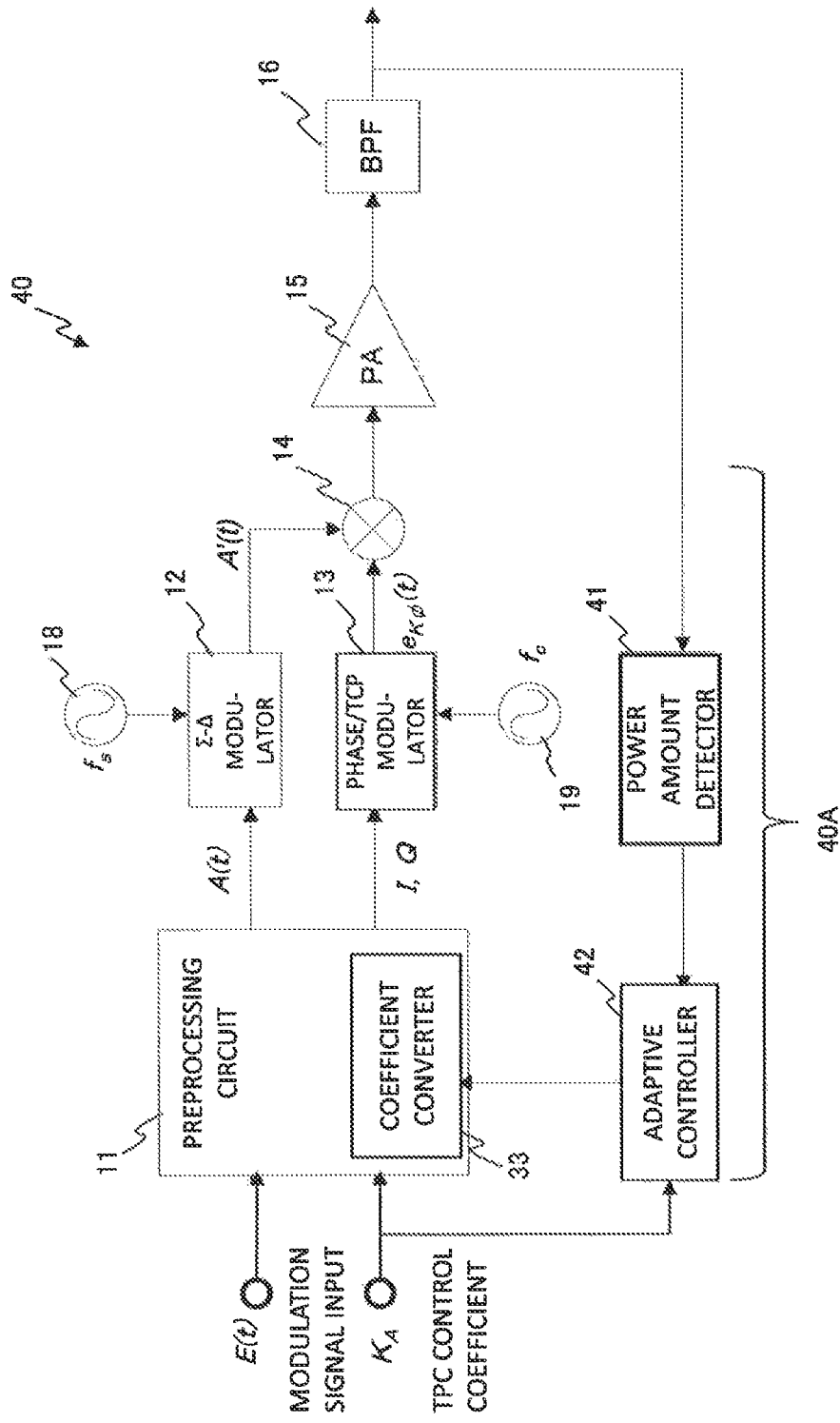
FIG. 9 is a diagram illustrating an example of a configuration of the transmission apparatus in a third embodiment.

Next, a third embodiment will be discussed. The same components as those in the first and second embodiments are marked with the same numerals and symbols, while their descriptions are omitted. FIG. 9 is a diagram illustrating an example of a configuration of the transmission apparatus in the third embodiment. In FIG. 9, a transmission circuit 40A of a transmission apparatus 40 is different from the transmission circuit 30A exemplified in the second embodiment in terms of including a power quantity detector 41 and an adaptive controller 42 in place of the controller 32. In the transmission circuit 40A, the voltage applied to the power amplifier 15, which is, i.e., the source voltage, is fixed.

The power quantity detector 41 detects the power quantity of the transmission signal output from the BPF 16. The adaptive controller 42 determines the correction coefficient $K_A'$ defined as a correction value of the TPC control coefficient on the basis of the TPC control coefficient $K_A$ and the power quantity given from the power quantity detector 41, and gives a transform instruction to the coefficient transformer 33. The coefficient transformer 33 transforms, based on the instruction given from the adaptive controller 42, the TPC control coefficient $K_A$ inputted to the preprocessing circuit 11 into the correction coefficient $K_A'$. In the transmission circuit 40A, the angle modulation component is multiplied by the TPC control coefficient $K_A$ or the correction coefficient $K_A'$.

An operational example of the third embodiment will hereinafter be described. For instance, when adjusting the transmission apparatus 40 at a factory, an assumption is that a representative value of the I/O characteristics of the power amplifier is applied to the transmission apparatus 40. In this case, there are predicted a dispersion of the device characteristics of the power amplifier, a temperature variation due to the use of the transmission apparatus 40 after being delivered or deterioration of the amplification characteristics due to a variation with time. Such being the case, the output of the transmission apparatus 40 is fed back, and a transform function of the control coefficient is adaptively controlled.

Figure 10:
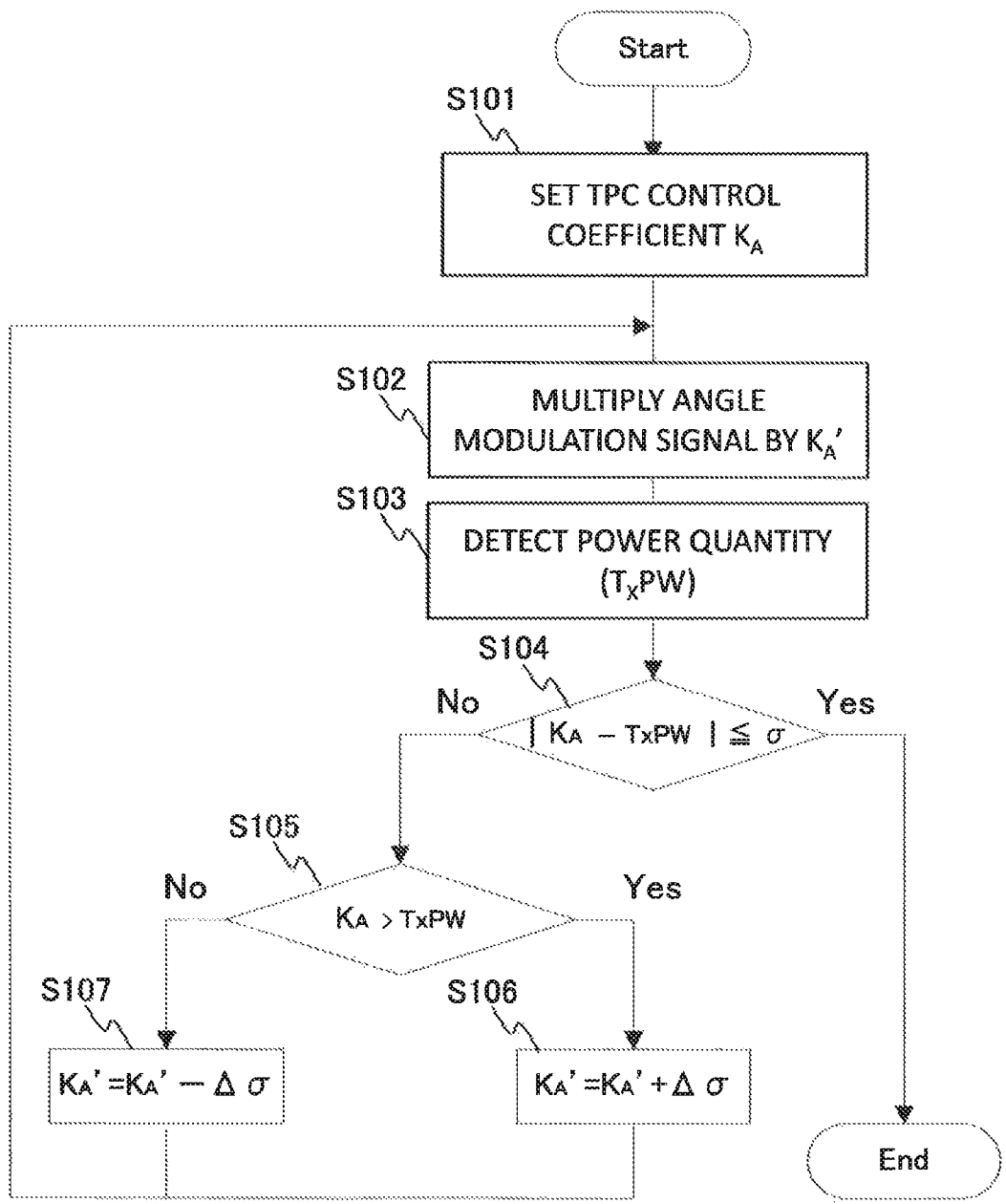
FIG. 10 is a flowchart illustrating an operational example of the transmission circuit in the third embodiment.

FIG. 10 is a flowchart illustrating an operational example of the transmission circuit 40A of the transmission apparatus 40. When the transmission apparatus 40 operates, the TPC control is executed, and the TPC control coefficient $K_A$ corresponding to the transmission power is set (S101). The TPC control coefficient $K_A$ is inputted to the preprocessing circuit 11.

In the preprocessing circuit 11, the coefficient transformer 33 transforms the TPC control coefficient $K_A$ into the correction coefficient $K_A'$, and the angle modulation component is multiplied by this correction coefficient $K_A'$ (S102). Thereafter, the operations explained in the first embodiment are carried out by the preprocessing circuit 11, the Σ-Δ modulator 12, the phase/TPC modulator 13 and the multiplier 14. The output signals of the multiplier 14 are power-amplified by the power amplifier 15 and are, after the BPF 16 has removed the components out of the transmission band, output as the transmission signals.

Some of the transmission signals, which are output from the BPF 16, are inputted to the power quantity detector 41 via a feedback path. The power quantity detector 41 detects a power quantity $T_XPW$ (i.e., the transmission output power) and inputs this power quantity to the adaptive controller 42 (S103).

The adaptive controller 42 determines whether a difference (error) between the TPC control coefficient $K_A$ and the power quantity $T_XPW$ is under an allowable power error range, i.e., an allowable range δ (S104). If the error is equal to or smaller than the allowable range δ (YES in S104), the process illustrated in FIG. 10 is finished.

Whereas if the error exceeds the allowable range δ (NO in S104), the adaptive controller 42 determines whether the present TPC control coefficient $K_A$ is larger than the power quantity $T_XPW$ or not (S105).

At this time, if the TPC control coefficient $K_A$ is larger than the power quantity $T_XPW$ (YES in S105), the adaptive controller 42 sets a value of the correction coefficient $K_A'$ held by the coefficient transformer 33 to a value obtained by adding a predetermined value Δσ to the present correction coefficient $K_A'$ (S106), and loops the processing back to S102. Whereas if the TPC control coefficient $K_A$ is equal to or smaller than the power quantity $T_XPW$ (NO in S105), the adaptive controller 42 sets the value of the correction coefficient $K_A'$ held by the coefficient transformer 33 to a value obtained by subtracting the predetermined value Δσ from the present correction coefficient $K_A'$ (S107), and loops the processing back to S102.

According to the third embodiment, it is feasible to acquire the same operational effects as those of the first embodiment. Further, according to the third embodiment, the output of the transmission apparatus 40 is fed back, thus detecting the transmission output power quantity $T_XPW$. The thus-acquired power quantity is compared with the TPC control coefficient $K_A$ set under the TPC control, and, in such a case that the error is larger than the allowable power error range 5, the correction coefficient $K_A'$ is controlled to increase if the set value is larger than the transmission output power but is controlled to decrease whereas if the set value is smaller than the transmission output power. With this contrivance, it is possible to use the TPC control coefficient suited to the transmission output power value.

Fourth Embodiment

Figure 11:
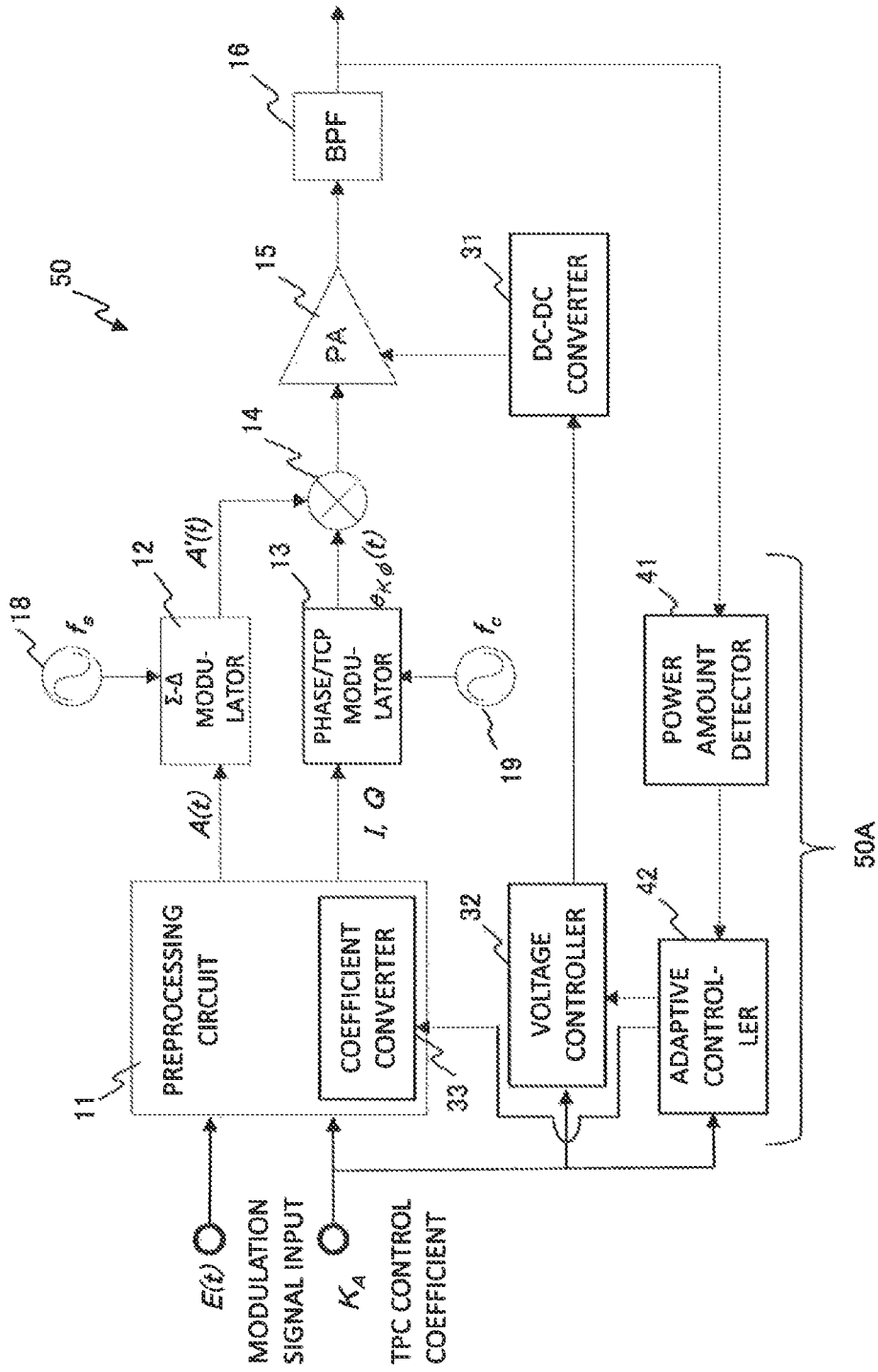
FIG. 11 is a diagram illustrating an example of a configuration of the transmission apparatus in a fourth embodiment.

Next, a fourth embodiment will be described. The same components as those in the first, second and third embodiments are marked with the same numerals and symbols, while their descriptions are omitted. FIG. 11 is a diagram illustrating an example of a configuration of the transmission apparatus in the fourth embodiment. In FIG. 11, a transmission circuit 50A of a transmission apparatus 50 is different from the transmission circuit 40A exemplified in the third embodiment in terms of including the DC-DC converter 31 and the source voltage controller 32 in the second embodiment in addition to the configuration of the transmission apparatus 30. In the transmission circuit 50A, the voltage applied to the power amplifier 15, which is, i.e., the source voltage, is variable.

Figure 12:
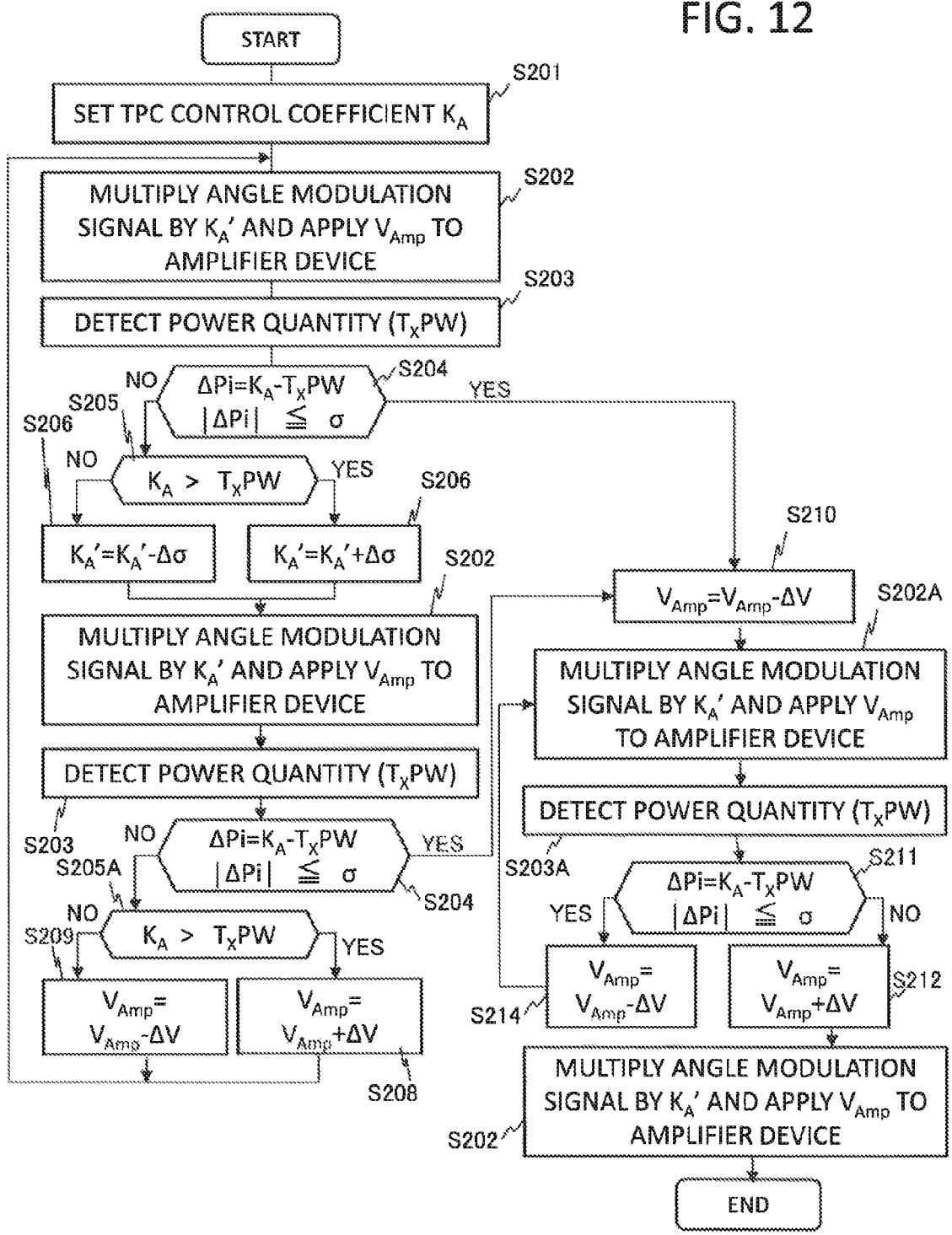
FIG. 12 is a flowchart illustrating an operational example of the transmission circuit in the fourth embodiment.

FIG. 12 is a flowchart illustrating an operational example of the transmission circuit 50A of the transmission apparatus 50. When the transmission apparatus 50 operates, the TPC control is performed, thereby setting the TPC control coefficient $K_A$ corresponding to the transmission power (S201). The TPC control coefficient $K_A$ is inputted to the preprocessing circuit 11.

In the preprocessing circuit 11, the coefficient transformer 33 transforms the TPC control coefficient $K_A$ into the correction coefficient $K_A'$, and the angle modulation component is multiplied by this correction coefficient $K_A'$. Thereafter, the operations described in the first embodiment are conducted by the preprocessing circuit 11, the Σ-Δ modulator 12, the phase/TPC modulator 13 and the multiplier 14. On the other hand, the source voltage controller 32 applies the applied voltage $V_{Amp}$ corresponding to the TPC control coefficient $K_A$ to the power amplifier 15 as the Amp device via the DC-DC converter 31 (S202).

The output signals of the multiplier 14 are power-amplified by the power amplifier 15 and are, after the BPF 16 has removed the components out of the transmission band, output as the transmission signals. Some of the transmission signals, which are output from the BPF 16, are inputted to the power quantity detector 41 via the feedback path. The power quantity detector 41 detects the power quantity $T_XPW$ (i.e., the transmission output power) and inputs this power quantity to the adaptive controller 42 (S203).

The adaptive controller 42 determines whether a difference (error ΔPi) between the TPC control coefficient $K_A$ and the power quantity $T_XPW$ is under the allowable power error range, i.e., the allowable range δ (S204). If the error is equal to or smaller than the allowable range δ (YES in S204), the processing advances to S210.

Whereas if the error exceeds the allowable range δ (NO in S204), an adjustment of the control coefficient is executed in advance of controlling the applied voltage. Namely, the adaptive controller 42 determines whether the present TPC control coefficient $K_A$ is larger than the power quantity $T_XPW$ or not (S205).

At this time, if the TPC control coefficient $K_A$ is larger than the power quantity $T_XPW$ (YES in S205), the adaptive controller 42 sets the value of the correction coefficient $K_A'$ held by the coefficient transformer 33 to the value obtained by adding the predetermined value Δσ to the present correction coefficient $K_A'$ (S206). Whereas if the TPC control coefficient $K_A$ is equal to or smaller than the power quantity $T_XPW$ (NO in S205), the adaptive controller 42 sets the value of the correction coefficient $K_A'$ held by the coefficient transformer 33 to the value obtained by subtracting the predetermined value Δσ from the present correction coefficient $K_A'$ (S207).

Upon finishing S206 or S207, the processes in S202-S205 are repeated. In S205 (which is referred to as "S205A" in FIG. 12) of the second time, if the TPC control coefficient $K_A$ is larger than the power quantity $T_XPW$ (YES in S205A), the adaptive controller 42 sets a value of the applied voltage $V_{Amp}$ held by the source voltage controller 32 to a value into which a predetermined value ΔV is added to the present applied voltage (S208). Whereas if the TPC control coefficient $K_A$ is equal to or smaller than the power quantity $T_XPW$ (NO in S205A), the adaptive controller 42 sets the value of the applied voltage $V_{Amp}$ held by the source voltage controller 32 to a value into which a predetermined value ΔV is subtracting from the present applied voltage (S209). When finishing the process in S208 or S209, the processing loops back to S202.

By the way, when the processing advances to S210, i.e., if the error exceeds the allowable range, the applied voltage control is carried out. To be specific, the adaptive controller 42 sets the value of the applied voltage $V_{Amp}$ held by the source voltage controller 32 to the value into which the predetermined value ΔV is subtracting from the present applied voltage.

Thereafter, the same process as S202 is executed (S202A), the power quantity $T_XPW$ is detected (S203A), and it is determined whether the error ΔPi is under the allowable range δ or not (S211). If the error exceeds the allowable range δ (NO in S211), the adaptive controller 42 sets the value of the applied voltage $V_{Amp}$ held by the source voltage controller 32 to a value into which the predetermined value ΔV is added to the present applied voltage (S212), and thereafter the same process as S202 is executed, thus finishing the processes in FIG. 12. The processes from S203A onward may also, however, be executed.

Whereas if the error is under the allowable range δ (YES in S211), the adaptive controller 42 sets the applied voltage $V_{Amp}$ held by the source voltage controller 32 to the value into which the predetermined value ΔV is subtracted from the present applied voltage (S214), and loops the processing back to S202A.

According to the fourth embodiment, the same operational effects as those in the first embodiment may be acquired. Moreover, according to the fourth embodiment, similarly to the third embodiment, the output of the transmission apparatus is fed back, and the power quantity of the transmission output is detected. The obtained power quantity is compared with the TPC control coefficient $K_A$ set under the TPC control, and, in such a case that the error is above the allowable power error range 5, at first the correction coefficient $K_A'$ is controlled. The correction coefficient $K_A'$ is controlled to increase if the TPC control coefficient $K_A$ is larger than the transmission output power but is controlled to decrease whereas if the set value is smaller than the transmission output power.

Thereafter, the correction coefficient $K_A'$ and the applied voltage $V_{Amp}$ are set again, and, if the error is above the allowable power error range δ, the applied voltage $V_{Amp}$ of the Amp device (the power amplifier 15) is controlled this time. The applied voltage $V_{Amp}$ is controlled to increase if the TPC control coefficient $K_A$ is larger than the transmission output power but is controlled to decrease whereas if the set value is smaller than the transmission output power. If the error does not fall within the allowable power error range δ, the operations described above are repeatedly conducted.

If the error falls within the allowable power error range δ, the voltage is controlled in such a direction as to be narrowed down (in a low voltage direction) to the greatest possible degree in order to cause the high-efficiency operation to be performed, and the control is repeated till reaching a proper voltage value not exceeding the allowable power error range.

If the error falls within the allowable power error range δ, the voltage is controlled in such a direction as to be narrowed down (in the low voltage direction) to the greatest possible degree in order to cause the high-efficiency operation to be conducted, and the control is repeated till reaching the proper voltage value not exceeding the allowable power error range. With this contrivance, it is possible to use the TPC control coefficient suited to the value of the transmission output power.

Note that the configurations exemplified in the first through fourth embodiments may be properly combined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission circuit comprising:
   a Σ–Δ modulator to perform Σ–Δ modulation of an amplitude modulation component of a modulation signal and to output a pulse width modulation signal;

an angle modulator to generate an angle modulation component signal of a signal obtained by multiplying the modulation signal by a transmission output control coefficient corresponding to a transmission output in a power amplifier; and a first multiplier to multiply the pulse width modulation signal by the angle modulation component signal and to output a result of the multiplication as an output signal to the power amplifier.

2. The transmission circuit according to claim 1, wherein the angle modulator includes:
   a cosine transformer to obtain a cosine as an in-phase component with respect to a phase of the modulation signal;
   a sine transformer to obtain a sine as a quadrature component with respect to the phase of the modulation signal;
   a second multiplier to multiply each of the in-phase component output from the cosine transformer and the quadrature component output from the sine transformer by the transmission output control coefficient; and
   a quadrature modulator to perform quadrature modulation of a carrier wave by use of a baseband signal containing the in-phase component and the quadrature component each multiplied by the transmission output control coefficient output from the second multiplier,
   wherein an output of the quadrature modulator is inputted as the angle modulation component signal to the first multiplier.

3. The transmission circuit according to claim 1, wherein the angle modulator includes:
   a cosine transformer to obtain a cosine as an in-phase component with respect to a phase of the modulation signal;
   a sine transformer to obtain a sine as a quadrature component with respect to the phase of the modulation signal;
   a quadrature modulator to perform quadrature modulation of a carrier wave by use of a baseband signal containing the in-phase component output from the cosine transformer and the quadrature component output from the sine transformer; and
   a second multiplier to multiply an output of the quadrature modulator by the transmission output control coefficient,
   wherein an output of the second multiplier is inputted as the angle modulation component signal to the first multiplier.

4. The transmission circuit according to claim 1, further comprising a voltage controller to determine an applied voltage applied to the power amplifier in a way that corresponds to the transmission output control coefficient.

5. The transmission circuit according to claim 1, further comprising a corrector to correct a value of the transmission output control coefficient multiplied to the angle modulation component of the modulation signal.

6. The transmission circuit according to claim 1, further comprising:
   a detector to detect a power quantity of the output signal of the power amplifier; and
   a determinator to determine whether or not an error between the power quantity and the transmission output control coefficient falls within an allowable range,
   wherein a corrector corrects the value of the transmission output control coefficient multiplied to the angle modulation component when the error is beyond the allowable range.

7. The transmission circuit according to claim 6, further comprising a voltage controller to control an applied voltage applied to the power amplifier,
   wherein the voltage controller varies the applied voltage applied to the power amplifier when an error between the power quantity of the output signal of the power amplifier after the corrector has corrected the transmission output control coefficient and the corrected transmission output control coefficient is beyond the allowable range.

8. The transmission circuit according to claim 6, further comprising a voltage controller to control an applied voltage applied to the power amplifier,
   wherein the voltage controller decreases a value of the applied voltage applied to the power amplifier when the error is within the allowable range.

* * * * *

UNITED STATES PATENT AND TRADEMARK OFFICE
CERTIFICATE OF CORRECTION

| | | |
|---|---|---|
| PATENT NO. | : 8,792,546 B2 | |
| APPLICATION NO. | : 13/529178 | |
| DATED | : July 29, 2014 | |
| INVENTOR(S) | : Nagatani et al. | |

It is certified that error appears in the above-identified patent and that said Letters Patent is hereby corrected as shown below:

Title Page, at item (73) the second Assignee should read as follows:

--The University of Electro-Communications--.

Signed and Sealed this
Seventeenth Day of March, 2015

Michelle K. Lee
*Director of the United States Patent and Trademark Office*